(12) United States Patent
Do et al.

(10) Patent No.: US 7,773,439 B2
(45) Date of Patent: *Aug. 10, 2010

(54) TEST OPERATION OF MULTI-PORT MEMORY DEVICE

(75) Inventors: Chang-Ho Do, Kyoungki-do (KR); Jin-Il Chung, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 894 days.

This patent is subject to a terminal disclaimer.

(21) Appl. No.: 11/647,625

(22) Filed: Dec. 28, 2006

(65) Prior Publication Data

US 2007/0245093 A1    Oct. 18, 2007

(30) Foreign Application Priority Data

Apr. 13, 2006  (KR) .................. 10-2006-0033750

(51) Int. Cl.
*G11C 7/00* (2006.01)
(52) U.S. Cl. ............. 365/201; 365/189.02; 365/230.05; 365/230.06; 365/220; 365/221
(58) Field of Classification Search ................. 365/201, 365/230.05, 189.02, 230.06, 220, 221
See application file for complete search history.

(56) References Cited

U.S. PATENT DOCUMENTS

| | | | |
|---|---|---|---|
| 5,740,379 A * | 4/1998 | Hartwig | 710/104 |
| 5,796,745 A | 8/1998 | Adams et al. | |
| 6,122,218 A | 9/2000 | Kang | |
| 6,550,026 B1 * | 4/2003 | Wright et al. | 714/719 |
| 6,594,196 B2 | 7/2003 | Hsu et al. | |
| 6,845,429 B2 | 1/2005 | Mattausch et al. | |
| 6,865,701 B1 | 3/2005 | Youngs et al. | |
| 2002/0146025 A1 | 10/2002 | Okina | |
| 2005/0249020 A1 | 11/2005 | Kim et al. | |
| 2005/0251713 A1 | 11/2005 | Lee | |
| 2008/0005493 A1 * | 1/2008 | Chung et al. | 711/149 |

FOREIGN PATENT DOCUMENTS

| | | |
|---|---|---|
| JP | 04-129087 | 4/1992 |
| JP | 7-52598 | 6/1995 |
| JP | 2002-230977 | 8/2002 |
| KR | 2000-0062525 | 10/2000 |
| KR | 2001-0108174 | 12/2001 |
| KR | 10-2005-0022855 | 3/2005 |
| KR | 1020070036610 A | 4/2007 |

* cited by examiner

*Primary Examiner*—Son Dinh
(74) *Attorney, Agent, or Firm*—Blakely, Sokoloff, Taylor & Zafman

(57) ABSTRACT

A multi-port memory device includes a plurality ports, a plurality of banks, a plurality of global data buses, first and second I/O controllers, and a test input/output (I/O) controller. The ports perform a serial I/O data transmission. The banks perform a parallel I/O data transmission with the ports. The global data buses are employed for transmitting data between the ports and the banks. The first I/O controller controls a serial data transmission between the ports and external devices. The second I/O controller controls a parallel data transmission between the ports and the global buses. The test I/O controller generates test commands based on a test command/address (C/A) inputted from the external devices and transmits a test I/O data with the global data bus during a test operation mode.

15 Claims, 13 Drawing Sheets

FIG. 4D

| 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| PHY | | CMD | ACT | WT | PCG | RD | ESC | ABNK | RFU | BANK | | | | COLUMN ADDRESS | | | | | |
| 1 | 0 | '1' | '0' | '0' | PCG | '1' | '0' | ABNK | '0' | 3 | 2 | 1 | 0 | 5 | 4 | 3 | 2 | 1 | 0 |

FIG. 4E

| 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| PHY | | ID | | UPPER BYTE | | | | | | | | LOWER BYTE | | | | | | | |
| 1 | 0 | '1' | '0' | 7 | 6 | 5 | 4 | 3 | 2 | 1 | 0 | 7 | 6 | 5 | 4 | 3 | 2 | 1 | 0 |

FIG. 4F

| 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| PHY | | CMD | ACT | COMMAND INFOMATION | | | | | | | | | | | | | | | |
| 1 | 0 | '1' | ACT | 15 | 14 | 13 | 12 | 11 | 10 | 9 | 8 | 7 | 6 | 5 | 4 | 3 | 2 | 1 | 0 |

TEST OPERATION OF MULTI-PORT MEMORY DEVICE

CROSS-REFERENCE TO RELATED APPLICATION

The present invention claims priority of Korean patent application number 10-2006-0033750, filed on Apr. 13, 2006, which is incorporated by reference in its entirety.

BACKGROUND OF THE INVENTION

The present invention relates to a semiconductor memory device, and more particularly to a semiconductor memory device including a plurality of ports for transmitting information with external devices.

Most memory devices such as a random access memory (RAM) include only one port for transmitting data with external chipsets. The port is constituted with a plurality of input/output (I/O) pins. The memory device including single port employs a parallel I/O interface for concurrently transmitting multi-bit data through a plurality of data lines connected to the plurality of I/O pins respectively. The I/O interface uses a data transmission scheme for transmitting data via data lines, each of which is connected between two devices. The data line uses a bus for transmitting signals such as an address signal, a data signal, and a control signal.

The parallel I/O interface provides a high data process speed because it can simultaneously transmit multi-bit data through a plurality of data lines. Therefore, the parallel I/O interface is widely used in a short distance transmission that requires a high speed. However, because a large number of buses are included for the parallel I/O interface, a data transmission cost increases when the data transmission is performed between long distance. Due to the limitation of the single port, a plurality of memory devices is independently configured so as to support various multi-media functions in terms of hardware of a multi-media system. While an operation for a certain function is carried out, an operation for another function cannot be concurrently carried out. Considering the disadvantage of the parallel I/O interface, many attempts to change the parallel I/O interface into serial I/O interface have been made. Also, considering compatible expansion with devices having other serial I/O interfaces, the change to serial I/O interface in I/O environment of the semiconductor memory device is required. Moreover, appliance devices for audio and video are embedded into display devices, such as a high definition television (HDTV) and a liquid crystal display (LCD) TV. Because these appliance devices require independent data processing, there is a demand for multi-port memory devices having a serial I/O interface using a plurality of ports.

FIG. 1 is a block diagram of a multi-port memory device disclosed in commonly owned co-pending applications, Korean patent application Nos. 2005-90936 and 2006-32948, filed in the Korean Intellectual Property Office on Sep. 29, 2005 and on Apr. 11, 2006, entitled "multi-port memory device with serial input/output interface", which are incorporated herein by reference.

For convenience of explanation, the multi-port memory device having four ports and eight banks is illustrated. Particularly, it is assumed that the multi-port memory device has a 16-bit data frame and performs a 64-bit prefetch operation.

As shown, the multi-port memory device includes first to fourth ports PORT0 to PORT3, first to eighth banks BANK0 to BANK7, first and second global input/output (I/O) data buses GIO_OUT<0:3> and GIO_IN<0:3>, and first to eighth bank control units BC0 to BC7. Each of the ports PORT0 to PORT3 located at a center of the multi-port memory device is arranged in a row direction, and performs a serial data communication with its own external device. The first to eighth banks BANK0 to BANK7 are classified into upper banks BANK0 to BANK3 and lower banks BANK4 to BANK7 based on their relative location with the first to fourth ports PORT0 to PORT3. The first global I/O bus GIO_OUT<0:3> is arranged in the row direction between the upper banks BANK0 to BANK3 and the first to fourth ports PORT0 to PORT3, and transmits output data in parallel. The second global I/O bus GIO_IN<0:3> is arranged in the row direction between the lower banks BANK4 to BANK7 and the first to fourth ports PORT0 to PORT3, and transmits input data in parallel. The first to eighth bank control units BC0 to BC7 control a signal transmission between the first and second global I/O buses GIO_OUT<0:3> and GIO_IN<0:3> and the first to eighth banks BANK0 to BANK7.

FIG. 2 is a detailed block diagram of the first bank BANK0 shown in FIG. 1. The other banks BANK1 to BANK7 have the same structure with that of the first bank BANK0.

The first bank BANK0 includes a memory cell array 10, row and column decoders 11 and 12, a write driver (W/D) 13, a data bus sense amplifier (DBSA) 14, and an equalizer (not shown). The memory cell array 10 includes a plurality of memory cells MCs arranged with an N by M matrix form, M and N being positive integers. Each of the row and column decoders 11 and 12 selects one of the memory cells MCs by a row and a column. The first to eighth banks BANK0 to BANK7 having such a constitution divide the multi-port memory device by half based on the first to fourth ports PORT0 to PORT3 so that the upper banks BANK0 to BANK3 and the lower banks BANK4 to BANK7 are symmetrically located at the row direction.

FIG. 3 is a block diagram of the first port PORT0 illustrated in FIG. 1. Each port PORT0 to PORT3 located at the center of the multi-port memory device is connected to the first and second global I/O data buses GIO_OUT<0:3> and GIO_IN<0:3> so as to independently access all banks. The other ports PORT1 to PORT3 have the same structure with that of the first port PORT0, and thus, the first port PORT0 is explained as an example.

As shown, the first port PORT0 includes a reception unit 41 and a transmission unit 42. The reception unit 41 receives signals input from the external devices through a reception pad RX, and the transmission unit 42 outputs signals output from the first to eighth banks BANK0 to BANK7 through a transmission pad TX. Hereinafter, the signals input from the external devices is referred to "input signals" and the signals output from the first to eighth banks BANK0 to BANK7 are referred to "output signals". The reception unit 41 and the transmission unit 42 operate independently so that the input signals and the output signals are simultaneously transmitted.

In detail, the reception unit 41 deserializes 20-bit input signals input in series to convert and output the deserialized input signals as 26-bit valid signals effective for an operation of the DRAM device. Herein, the 26-bit valid signals include an 8-bit port/bank selection signal group P0_RK<0:7>, and an 18-bit input valid data signal group P0_RX<0:17>. The 18-bit input valid data signal group P0_RX<0:17> includes a command flag signal, a row address strobe/data mask (RAS/DM) signal, and 16-bit command/address/data signals. Herein, the 16-bit command/address/data signals may be addresses, commands or data signals.

FIGS. 4A to 4F are frame formats of the input signals input to the first port PORT0 shown in FIG. 3. FIG. 4A is a basic frame format; FIG. 4B is a write command frame format;

FIG. 4C is a write data frame format; FIG. 4D is a read command frame format; FIG. 4E is a read data frame format; and FIG. 4F is a command frame format.

As an example, the write command frame and the write data frame shown in FIGS. 4B and 4C are described in detail.

Referring to FIG. 4B, the write command frame is a unit of 20-bit serialized signals input from the external devices. 18th and 19th bits PHY among the 20-bit serialized signals correspond to a physical link coding bit, a 17th bit CMD means a command start point, a 16th bit ACT means an internal active state, a 15th bit WT corresponds to an internal write command, and a 14th bit PCG means an internal inactive state. For example, during a normal write operation, 17th to 14th bits become "1010". During an auto-precharge write operation, 17th to 14th bits become "1011". 13th to 10th bits UDM are used as an upper-byte write data mask signal of write data input during four clocks, 9th to 6th bits BANK mean bank data written during a write operation, and the 5th to 0th bits COLUMN ADDRESS mean a column address. The write data frame shown in FIG. 4C is input during four clocks after the write command frame shown in FIG. 4B is input. Herein, a 17th bit CMD becomes a logic level "LOW", a 16th bit LDM are used as a lower-byte write data mask signal of the write data, and each of 15th to 8th bits UPPER BYTE and 7th to 0th bits LOWER BYTE means an upper byte and a lower byte of the write data, respectively.

Referring to FIGS. 3 to 4F, detailed constitutions of the reception unit 41 and the transmission unit 42 are described.

The reception unit 41 includes a deserializer 411, a command generation unit 412, a bank address generation unit 413, a bank address output unit 414, and a valid input data output unit 415. The deserializer 411 deserializes the 20-bit input signals, i.e., one frame, input from the external devices through the reception pad RX in series and outputs the deserialized input signals as 20-bit parallel signals. The command generation unit 412 determines an operation of the 20-bit parallel signals by using the 17th bit CMD of the 20-bit parallel signals outputted from the deserializer 411. That is, if the 17th bit CMD of the write command frame shown in FIG. 4B is a logic level "LOW", the command generation unit 412 determines the 20-bit parallel signals performs a write operation; and if the 17th bit CMD is a logic level "HIGH", the command generation unit 412 determines the 20-bit parallel signals performs a read operation. Further, the command generation unit 412 outputs a bank information bit utilized as bank data of the 20-bit parallel signals. Herein, the number of the bank information bit is three because the number of banks is eight, and this bit is included in a frame payload shown in FIG. 4A. The bank address generation unit 413 outputs 8-bit bank addresses for selecting a corresponding bank among the first to eighth banks BANK0 to BANK7 based on the 3-bit bank information bit. The bank address generation unit 413 may include a 3 by 8 decoder which outputs 8-bit output signals by receiving 3-bit input signals. The bank address output unit 414 outputs the 8-bit port/bank selection signal group P0_BK<0:7> to the second global I/O data bus GIO_IN<0:3> based on the 8-bit bank addresses inputted from the bank address generation unit 413. The bank address output unit 414 may include a plurality of output drivers. The valid input data output unit 415 outputs the 18-bit valid input data signal group P0_RX<0:17> to the second global I/O data bus GIO_IN<0:3> based on output signals from the deserializer 411. The valid input data output unit 415 may include a plurality of output drivers.

The transmission unit 42 receives and serializes a valid output data signal group P0_DATA<0:15> output from the banks through the first global data bus GIO_OUT<0:3> in parallel to output the serialized signals to the transmission pad TX. In detail, the transmission unit 42 includes a serializer 421 and a valid output data input unit 422. The valid output data input unit 422 receives the 16-bit valid output data signal group P0_DATA<0:15> inputted from the banks through the first global data bus GIO_OUT<0:3>, and makes them fit for a transmission protocol under the control of the command generation unit 412, i.e., according to the read or write operation. As a result, 20-bit frame output signals are outputted. The valid output data input unit 422 may include a plurality of input drivers. The serializer 421 serializes the 20-bit frame output signals inputted from the output valid data input unit 422 in parallel, and outputs the serialized signals to the transmission pad TX in series.

Meanwhile, the first global I/O data bus GIO_OUT<0:3> includes 64-bit buses, i.e., 16 by 4, for transmitting the valid output data signal group Pi_DATA<0:15> inputted from the banks to each port independently. Herein, "16" is the number of data bits and "4" is the number of ports. The second global I/O data bus GIO_IN<0:3> includes 104-bit buses, i.e., 26 by 4, for transmitting the valid input data signal group Pi_RX<0:17> and the port/bank selection signal group Pi_BK<0:7> inputted from the ports to each bank independently. Herein, the "i" corresponds to the number of ports as an integer from 0 to 3. The first and second global I/O data buses GIO_OUT<0:3> and GIO_IN<0:3> are connected to a plurality of local data buses for transferring signals with each bank control unit or each port. The local data buses connect the first and second global I/O data buses GIO_OUT<0:3> and GIO_IN<0:3> to the first to eighth bank control units BC0 to BC7 or the first to fourth ports PORT0 to PORT3. For convenience of explanation, the local data buses are classified into first to fourth local data buses.

FIG. 5 is a detailed block diagram of the first bank control unit BC0 shown in FIG. 1. Each of the first to eighth bank control units BC0 to BC7 is arranged for a corresponding one of the first to eighth banks BANK0 to BANK7 to thereby control transferring signals between the corresponding bank and each port PORT0 to PORT3. The bank control units BC1 to BC7 have the same structure with that of the first bank control unit BC0, and thus, the first bank control unit BC0 is explained as an example.

Referring to FIG. 5, the first bank control unit BC0 includes a deserializer 61, a serializer 62, a state machine unit 63, an input signal state discrimination unit 64, a bank selection unit 65, and a port selection unit 66.

The bank selection unit 65 selects one signal group of a plurality of the 18-bit valid input data signal groups Pi_RX<0:17> output from each port in response to a 8-bit bank selection signal group BK0_P<0:3> and transmits it as a 18-bit bank valid data signal group B0_RX<0:17> to the first bank BANK0. Herein, the 4-bit bank selection signal group BK0_P<0:3> is part of the 8-bit port/bank selection signal group Pi_BK<0:7>. That is, the bank selection unit 65 receives 22-bit signals including the 4-bit bank selection signal group BK0_P<0:3> and the 18-bit input valid data signal group Pi_RX<0:17> from all ports through the second global I/O data bus GIO_IN<0:3> to thereby output the 18-bit bank valid data signal group B0_RX<0:17> corresponding to the first bank BANK0.

A 16-bit signal group of the 18-bit bank valid data signal group B0_RX<0:17> is used as data, addresses or commands such as a bank mode determination signal; a 1-bit signal is used as an active flag signal; and a 1-bit signal is used as a command flag signal for discriminating whether the 16-bit signal group is data signals or not. For instance, a seventeenth bank valid data signal B0_RX<16> of the 18-bit bank valid data signal group B0_RX<0:17> is used as the active flag signal and an eighteenth bank valid data signal B0_RX<17>, i.e., a most significant bit (MSB), is used as the command flag signal. Herein, the seventeenth bank valid data signal B0_RX<16> is used as the row address strobe/data mask (RAS/DM) signal, and the eighteenth bank valid data signal B0_RX<17> is used as an enable signal of the state machine unit 63. For reference, the RAS signal is an initial signal of the DRAM device as a chip enable signal for controlling an operation of the DRAM device.

The input signal state discrimination unit 64 receives the 18-bit bank valid data signal group B0_RX<0:17> and discriminates whether it is data, addresses or commands. In detail, the input signal state discrimination unit 64 discriminates whether the 16-bit signal group B0_RX<0:15> is data, addresses or commands based on status of the most significant bit (MSB) B0_RX<17>. When the 16-bit signal group B0_RX<0:15> is discriminated as data, the 16-bit signal group B0_RX<0:15> is transferred to the deserializer 61. Otherwise, the 18-bit bank valid data signal group B0_RX<0:17> is transferred to the state machine unit 63.

The state machine unit 63 outputs an address/command signal ADD/CON based on the 18-bit bank valid data signal group B0_RX<0:17>. The address/command signal ADD/CON controls the operation of the DRAM device and includes internal command signals, internal address signals, and internal control signals. The internal command signals include an internal active signal ACT, an internal inactive state PCG, an internal read command signal READ, and an internal write command signal WRITE. The internal address signals include a row address XADD and a column address YADD. The internal control signals include an input data strobe signal such as DSTROBE16<0:3> and DSTROBE64, a driving enable signal group DRVEN_P<0:3>, a pipe input strobe signal PINSTROBE, and a pipe output control signal group POUT<0:3>.

The deserializer 61 converts the 16-bit signal group B0_RX<0:15> into 64-bit parallel output data and outputs it to the write driver (W/D) 13 of the corresponding bank. Herein, though the 16-bit signal group B0_RX<0:15> has a parallel form, it has to be converted into the 64-bit parallel output data because each memory cell of the banks performs a read or write operation with 64-bit data.

The serializer 62 converts 64-bit data signals outputted from the plurality of the DBSAs 14 into a 16-bit output data signal group DO<0:15>_B0 in response to the pipe input strobe signal PINSTROBE and the pipe output control signal group POUT<0:3>.

The port selection unit 66 sequentially receives the 16-bit output data signal group DO<0:15>_B0 outputted from the serializer 62 in units of 16-bit and outputs the valid data signal group Pi_DATA<0:15> to a corresponding port selected by decoding a 4-bit port selection signal group BRX_P<0:3>. Herein, the 4-bit port selection signal group BRX_P<0:3> is parts of the 8-bit port/bank selection signal group Pi_BK<0:7>. The port selection unit 66 includes four demultiplexers. Each demultiplexer is allocated to each port so as to independently perform a signal transmission with all ports PORT0 to PORT3. Further, each demultiplexer includes sixteen drivers for processing the 16-bit output data signal group DO<0:15>.

FIG. 6 is a circuit diagram of the state machine unit 63 shown in FIG. 5.

The state machine unit 63 includes a command generating unit 631, an input data strobe generating unit 632, a row address generating unit 633, a column address generating unit 634, a read data pipe controller 635, and a data output controller 636.

The command generating unit 631 is enabled in response to two MSB bank valid data signals B0_RX<16:17> and generates the internal command signals such as the internal active signal ACT, the internal inactive state PCG, the internal read command signal READ, and the internal write command signal WRITE by decoding the other 16-bit signal group B0_RX<0:15>. The command generating unit 631 includes a decoder for generating 2n digital signals by receiving n digital signals, n being a positive integer. The input data strobe generating unit 632 generates the input data strobe signal such as DSTROBE16<0:3> and DSTROBE64 in response to the eighteenth bank valid data signal B0_RX<17> and the internal write command signal WRITE. Herein, the input data strobe signal such as DSTROBE16<0:3> and DSTROBE64 are control signals for controlling an operation of the deserializer 61. The row address generating unit 633 receives the bank valid data signal group BRX<0:m> to generate a row address group XADD<0:m> in response to the internal active signal ACT, m being a positive integer. The column address generating unit 634 receives the bank valid data signal group BRX<0:n> to generate a column address group YADD<0:n> in response to the internal read command signal READ and the internal write command signal WRITE, n being a positive integer. The read data pipe controller 635 generates the pipe input strobe signal PINSTROBE and the pipe output control signal group POUT<0:3> in response to the internal read command signal READ. The data output controller 636 receives the port selection signal group BRX_P<0:3> to generate the driving enable signal group DRVEN_P<0:3> in response to the internal read command signal READ. Herein, the driving enable signal group DRVEN_P<0:3> is a control signal for controlling an operation of the port selection unit 66.

Hereinafter, an operation of the conventional multi-port memory device will be explained in detail.

FIG. 7 is a signal diagram illustrating a signal input path from the ports to the banks, and FIG. 8 is a signal diagram illustrating a signal output path from the banks to the ports. Herein, the signal input path is related to the 8-bit port/bank selection signal group Pi_BK<0:7> and the 18-bit input valid data signal group Pi_RX<0:17>, and the signal output path is related to the valid data signal group Pi_data<0:15>.

First, the signal input path from the first port PORT0 to the second bank BANK1 is described.

Referring to FIG. 7, the 20-bit input signals are inputted from the external devices to each port through the reception pad RX in series. Each port converts the 20-bit input signals into the 26-bit valid signals including the 8-bit port/bank selection signal group Pi_BK<0:7> and the 18-bit input valid data signal group Pi_RX<0:17>, and outputs them to the second global I/O data bus GIO_IN<0:3>. At this time, the second global I/O data bus GIO_IN<0:3> is connected to the other banks, i.e., BANK0 and BANK2 to BANK7, as well as the second bank BANK1 through a second local I/O data bus LIO_BIN shown in FIG. 1. As a result, the 26-bit valid signals are transferred to the bank selection unit 65 of all bank control units BC0 to BC7 through the second local I/O data bus LIO_BIN.

At this time, because the 18-bit input valid data signal group P0_RX<0:17> output from the first port PORT0 is only transferred to the second bank BANK1, the 8-bit port/bank selection signal group P0_BK<0:7> is required to prevent the 18-bit input valid data signal group P0_RX<0:17> from being transferred to the other banks BANK0 and BANK2 to BANK7.

The bank selection unit 65 of the second bank control unit BC1 receives the 18-bit input valid data signal group P0_RX<0:17> in response to the 4-bit bank selection signal group BK1_P<0:3>, and transfers it as the 18-bit bank valid data signal group B1_RX<0:17> to the second bank BANK1. At this time, the other bank selection signal groups BK0_P<0:3> and BK2_P<0:3> to BK7_P<0:3> are inactivated so that the bank selection unit 65 of the other bank control units, i.e., BC0 and BC2 to BC7, does not operate. As a result, the 18-bit input valid data signal group P0_RX<0:17> is not transferred to the other banks BANK0 and BANK2 to BANK7.

Second, the signal output path from the second bank BANK1 to the first port PORT0 is described.

Referring to FIG. 8, the serializer 62 of the second bank control unit BC1 serializes the 64-bit data signals outputted from the second bank BANK1 and outputs the 16-bit output data signal group DO<0:15>_B1 to the demultiplexers of port selection unit 66. The demultiplexers receives the 16-bit output data signal group DO<0:15>_B1 to output it as the 16-bit valid output data signal group P0_DATA<0:15> to the first global I/O data bus GIO_OUT<0:3> in response to a first driving enable signal DRVEN_P<0> of the driving enable signal group DRVEN_P<0:3>. The 16-bit valid output data signal group P0_DATA<0:15> loaded to the first global I/O data bus GIO_OUT<0:3> is transferred to the first port PORT0 through a third local I/O data bus LIO_P1.

Third, a normal read operation of the multi-port memory device is explained. The normal read operation means to fetch data from a specific address of a corresponding bank.

If the read command frame format or the read data frame format shown in FIGS. 4D and 4E is input to the first port PORT0 through the reception port RX in series, the first port PORT0 parallelizes and converts the inputted signals into the 26-bit valid signals. The 26-bit valid signals are inputted to the bank selection unit 65 of the second bank control unit BC1 through the second global I/O data bus GIO_IN<0:3>. At this time, because the bank selection unit 65 is connected with the second global I/O data bus GIO_IN<0:3> and the second local I/O data bus LIO_BIN shown in FIG. 2, the bank selection unit 65 of the second bank control unit BC1 receives the 26-bit valid signals from the other parts PORT1 to PORT3 as well as the first port PORT0. Accordingly, the 26-bit valid signals includes the 8-bit port/bank selection signal group Pi_BK<0:7> to select a required bank, and each bank selection unit 65 selects the required bank based on the 8-bit port/bank selection signal group Pi_BK<0:7>. Herein, a bank selection signal corresponding to the second bank BANK1 is only activated, and thus, the bank selection unit 65 of the second bank control unit BC1 receives the 18-bit input valid data signal group P0_RX<0:17> from the first port PORT0.

The state machine unit 63 of the second bank control unit BC1 activates the internal active signal ACT and the internal read command signal READ based on the 18-bit input valid data signal group P0_RX<0:17>. The row and column address generating units 633 and 634 of the state machine unit 63 generate the row and column addresses XADD and YADD of the second bank BANK1 based on the internal active signal ACT and the internal read command signal READ. The read data pipe controller 635 activates the pipe input strobe signal PINSTROBE and the pipe output control signal group POUT<0:3>, and the data output controller 636 activates the driving enable signal group DRVEN_P<0:3>. The 64-bit data signals are amplified by the plurality of the DBSAs 14 of the second bank BANK1 and are outputted to the serializer 62 according to the column address YADD in response to the internal read command signal READ.

The serializer 62 serializes the 64-bit data signals output from the plurality of the DBSAs 14 to output the 16-bit output data signal group DO<0:15>_B1 in response to the pipe input strobe signal PINSTROBE and the pipe output control signal group POUT<0:3>. That is, the serializer 62 converts the 64-bit data signals into the 16-bit output data signal group DO<0:15>_B1 in units of four, and sequentially outputs the 16-bit output data signal group DO<0:15>_B1 to the port selection unit 66.

The port selection unit 66 receives the 16-bit output data signal group DO<0:15>_B1 and outputs the valid data signal group Pi_DATA<0:15> to the first port PORT0 through the first global I/O data bus GIO_OUT<0:3> in units of 16-bit based on the driving enable signal group DRVEN_P<0:3> which is generated by decoding the 4-bit port selection signal group BRX_P<0:3>. Referring to FIG. 4, the first port PORT0 serializes and outputs the valid data signal group Pi_DATA<0:15> to the external devices through the transmission pad TX.

Fourth, a normal write operation of the multi-port memory device is explained. The normal write operation means to write data to a specific address of a corresponding bank. Input signals of the conventional multi-port memory device having five frame formats are inputted through the reception pad RX during the normal write operation. A first frame is a command frame shown in FIG. 4B, and the other frames are data frames shown in FIG. 4C. Each frame includes 16-bit data, and thus, a total frame includes 64-bit data.

The command and data frame formats are consecutively inputted to the first port PORT0, the deserializer 411 of the first port PORT0 deserializes and converts each frame format into the 26-bit valid signals. The bank selection unit 65 of the second bank control unit BC1 receives the 26-bit valid signals input from the first port PORT0 through the second global I/O data bus second global I/O data bus GIO_IN<0:3>. At this time, because the bank selection unit 65 of the second bank control unit BC1 is connected with the second global I/O data bus GIO_IN<0:3> and the second local I/O data bus LIO_BIN shown in FIG. 2, the bank selection unit 65 of the second bank control unit BC1 receives the 26-bit valid signals from the other ports PORT1 to PORT3 as well as the first port PORT0. Accordingly, the 26-bit valid signals includes the 8-bit port/bank selection signal group Pi_BK<0:7> to select a required bank, and each bank selection unit 65 selects the required bank based on the 8-bit port/bank selection signal group Pi_BK<0:7>. Herein, a bank selection signal corresponding to the second bank BANK1 is only activated, and thus, the bank selection unit 65 of the second bank control unit BC1 receives the 18-bit input valid data signal group P0_RX<0:17> from the first port PORT0.

The state machine unit 63 of the second bank control unit BC1 activates the internal active signal ACT and the internal write command signal WRIRE based on the 18-bit input valid data signal group P0_RX<0:17>. The row and column address generating units 633 and 634 of the state machine unit 63 generate the row and column addresses XADD and YADD of the second bank BANK1, and the input data strobe generating unit 632 generates the input data strobe signals DSTROBE16<0:3> and DSTROBE64 in response to the eighteenth bank valid data signal BRX<17>, the internal active signal ACT and the internal write command signal WRITE. Then, after the other data frames are consecutively inputted, the deserializer 61 of the second bank control unit BC1 converts the 16-bit signal group B1_RX<0:15> relating to the 18-bit input valid data signal group P0_RX<0:17> into the 64-bit parallel output data. The write driver (W/D) 13 of the second bank BANK1 writes the 64-bit parallel output data to the memory cell array 10.

During the normal write operation, if four frames including a data frame are consecutively inputted, 64 data bits are written to the memory cell array at the same time. However, before all of the four frames are inputted, another command can be performed by an interrupt. At this time, data inputted before the interrupt is performed are only written to the memory cell array.

Tests for the multi-port memory device described above are performed through the ports which provide a high data process speed. However, most DRAM test devices currently used cannot support the high data process speed provided by the ports. Further, when the ports operate erroneously, it is impossible to test the multi-port memory device correctly. Therefore, it is very advantageous to perform tests for the multi-port memory device independent of the ports.

SUMMARY OF THE INVENTION

Embodiments of the present invention are directed to provide a multi-port memory device performing a test operation by directly transmitting data between a test device and the banks without passing through the ports.

In accordance with an aspect of the present invention, there is provided a multi-port memory device includes a plurality of ports, a plurality of banks, a plurality of global data buses, and a plurality of test input/output (I/O) controllers. The ports perform a serial I/O data transmission. The banks perform a parallel I/O data transmission with the ports. The global data buses transmit data between the ports and the banks. The test I/O controllers transmit a test signal and a test input signal to a core area of the banks without passing through the ports and transmit a test output signal corresponding to the test signal to external devices without transmitting through the ports during a test operation.

In accordance with another aspect of the present invention, there is provided a multi-port memory device which includes a plurality of ports, a plurality of banks, a plurality of global data buses, first and second I/O controllers, and a test input/output (I/O) controller. The ports perform a serial I/O data transmission. The banks perform a parallel I/O data transmission with the ports. The global data buses are employed for transmitting data between the ports and the banks. The first I/O controller controls a serial data transmission between the ports and external devices. The second I/O controller controls a parallel data transmission between the ports and the global buses. The test I/O controller generates test commands based on a test command/address (C/A) inputted from the external devices and transmits a test I/O data with the global data bus during a test operation mode.

The test I/O controller includes a column decoder, first and second multiplexers (MUX), a demultiplexer (DEMUX), and a tri-state buffer. The column decoder decodes the test C/A to thereby generate an internal read command and an internal write command, buffers and outputs the test C/A and a bank address, and generates a global data bus selection signal. The first MUX outputs the test C/A, the bank address, and the test I/O data as a test input signal in response to the internal write command. The DEMUX transmits the test input signal to the second I/O controller in response to the global data bus selection signal. The second MUX outputs a test output signal transmitted from the global data bus in response to the global data bus selection signal. The tri-state buffer outputs the test output signal in response to the internal read command.

BRIEF DESCRIPTION OF THE DRAWINGS

FIGS. 4A to 4F are frame formats of the input signals input to the first port shown in FIG. 3.

DESCRIPTION OF SPECIFIC EMBODIMENTS

The multi-port memory device in accordance with the present invention performs the test operation by directly transmitting data between a test device and the banks without passing through the ports. Therefore, the test operation is effectively performed with the test devices whose data transmission speed is relatively slower than that of the ports. Further, the test reliability is improved because the test operation is not affected by port error. The present invention can be widely employed with multi-port memory devices for performing serial data transmission between external devices and the ports and performing parallel data transmission between the ports and the banks.

Figure 1:
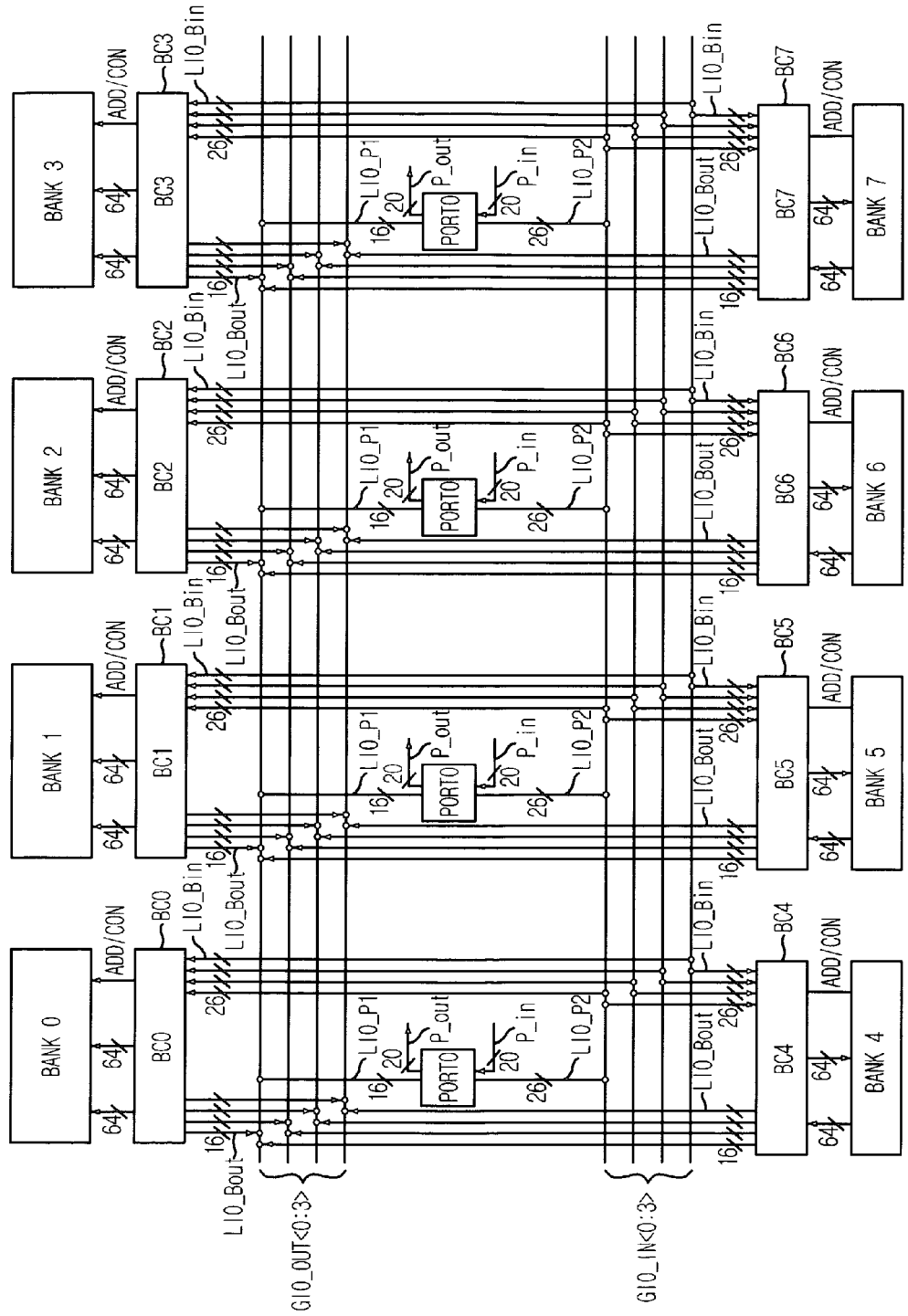
FIG. 1 is a block diagram of a conventional multi-port memory device.
Figure 2:
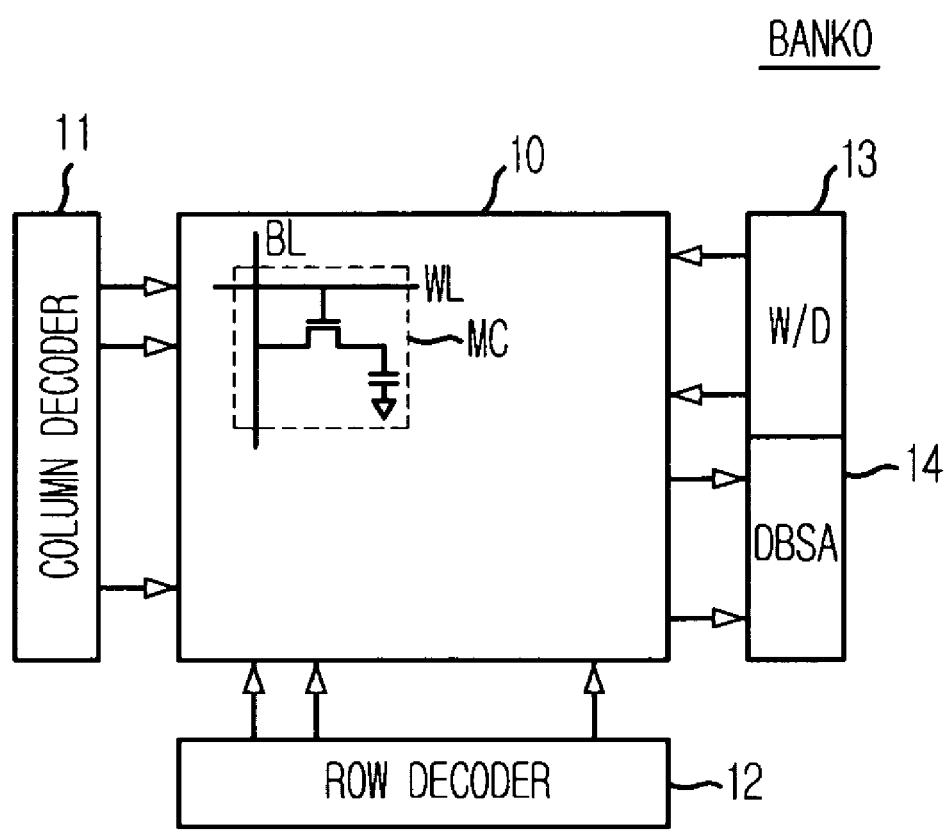
FIG. 2 is a detailed block diagram of the first bank shown in FIG. 1.
Figure 3:
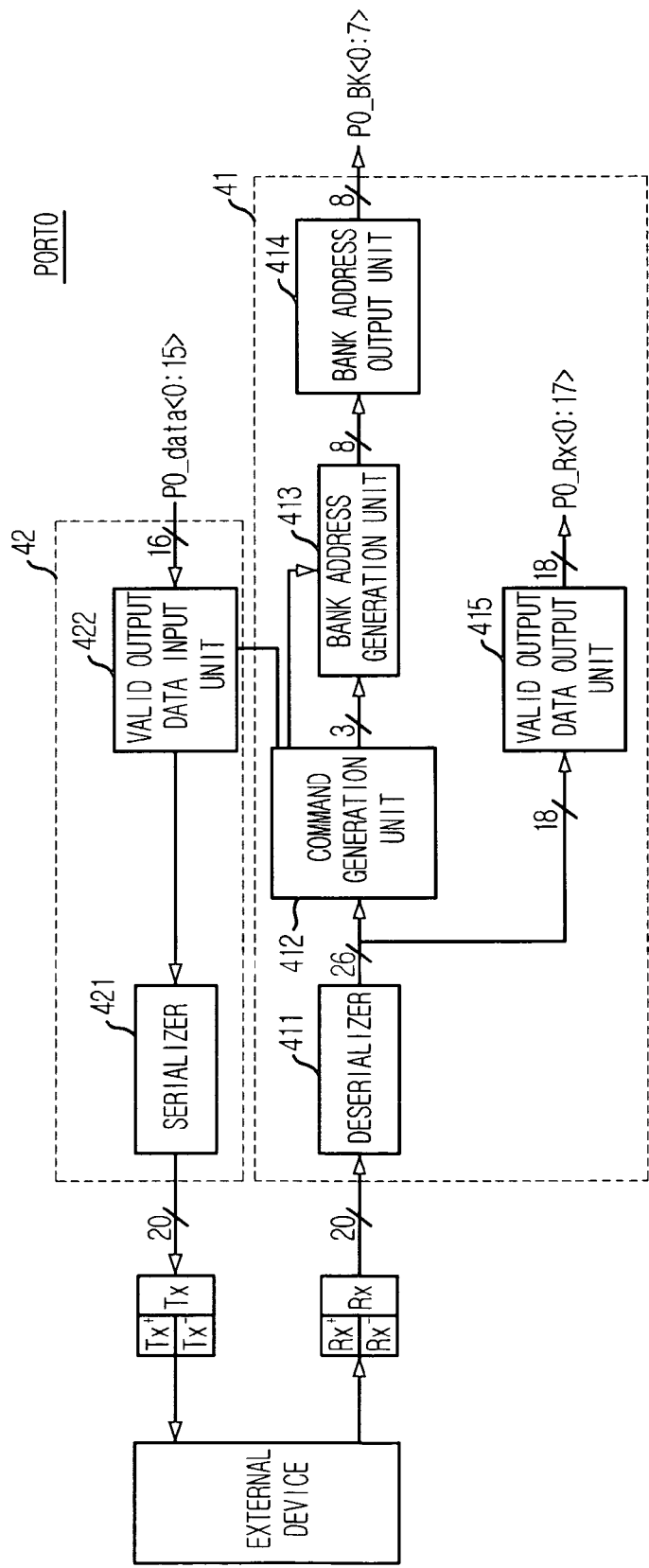
FIG. 3 is a block diagram of the first port illustrated in FIG. 1.
Figure 4A:
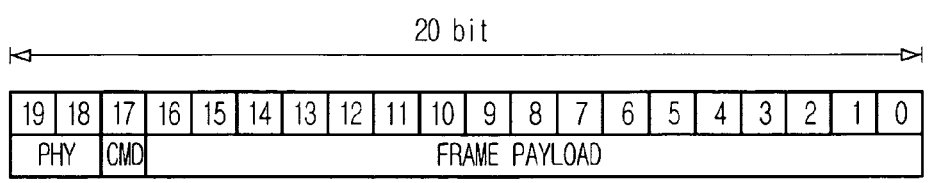
Figure 4B:
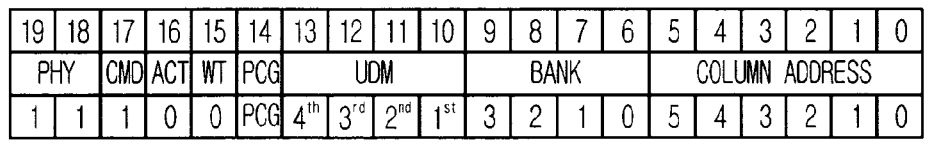
Figure 4C:
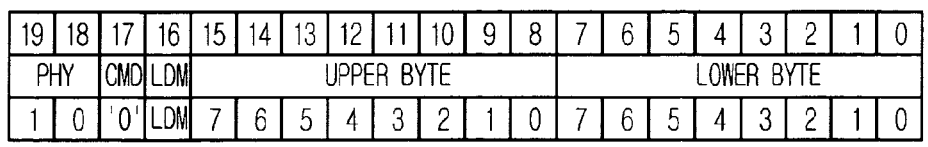
Figure 5:
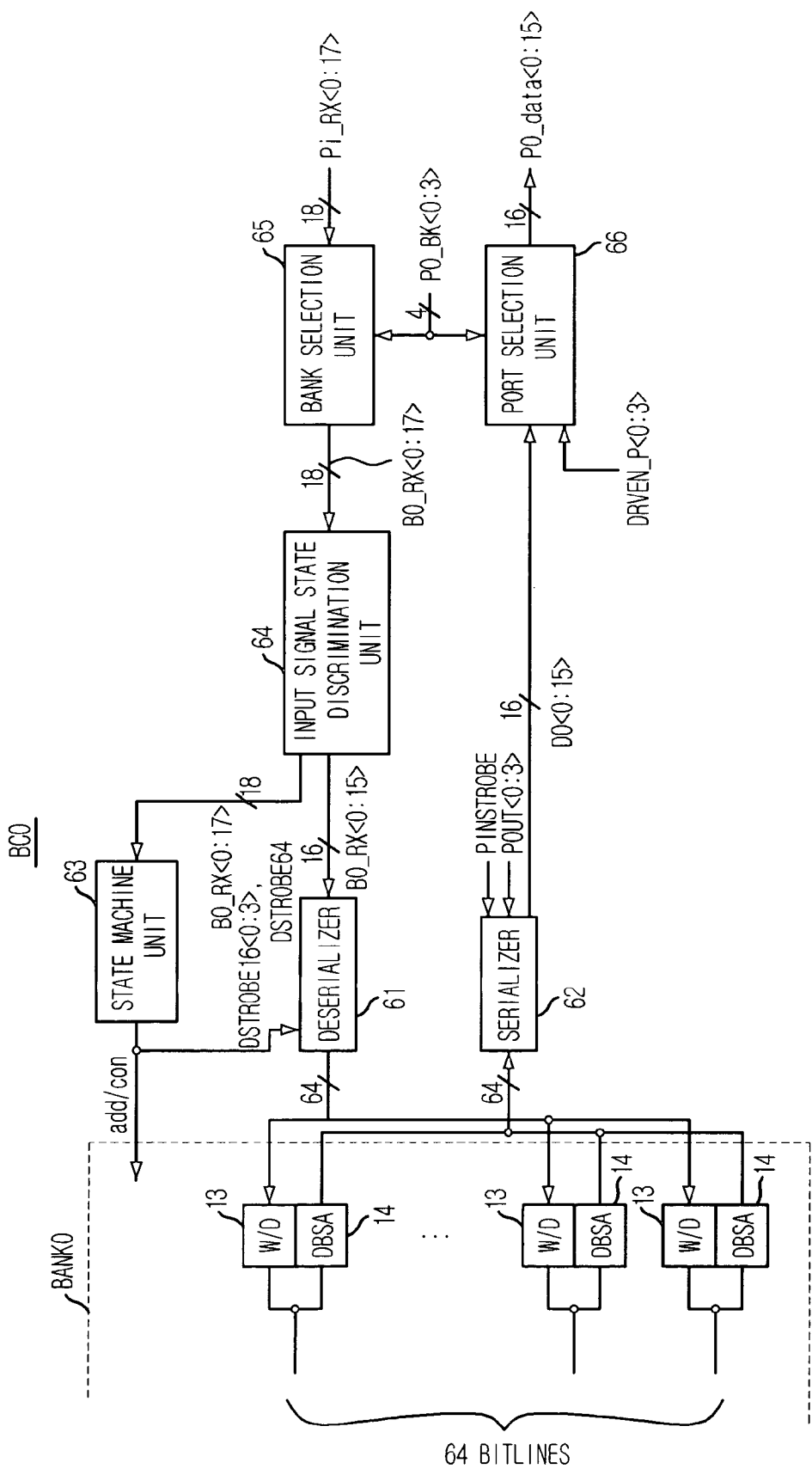
FIG. 5 is a detailed block diagram of the first bank control unit shown in FIG. 1.
Figure 6:
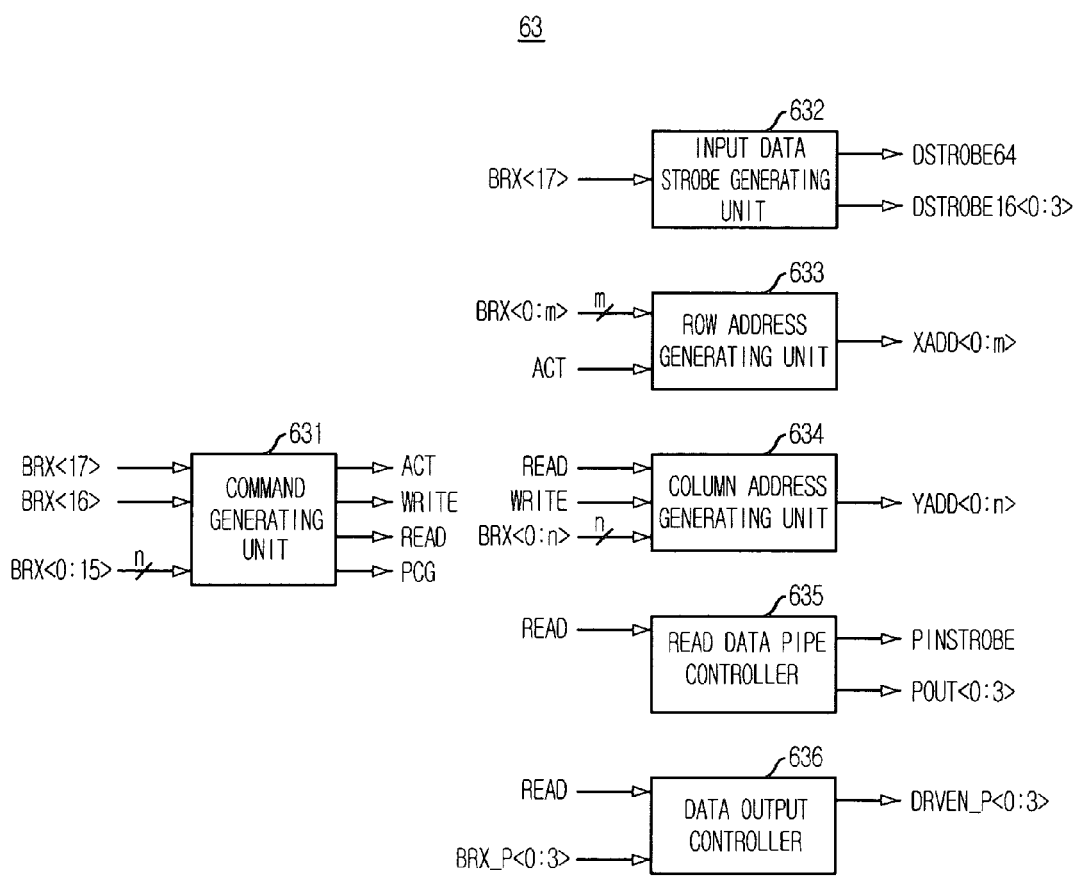
FIG. 6 is a circuit diagram of the state machine unit 63 shown in FIG. 5.
Figure 7:
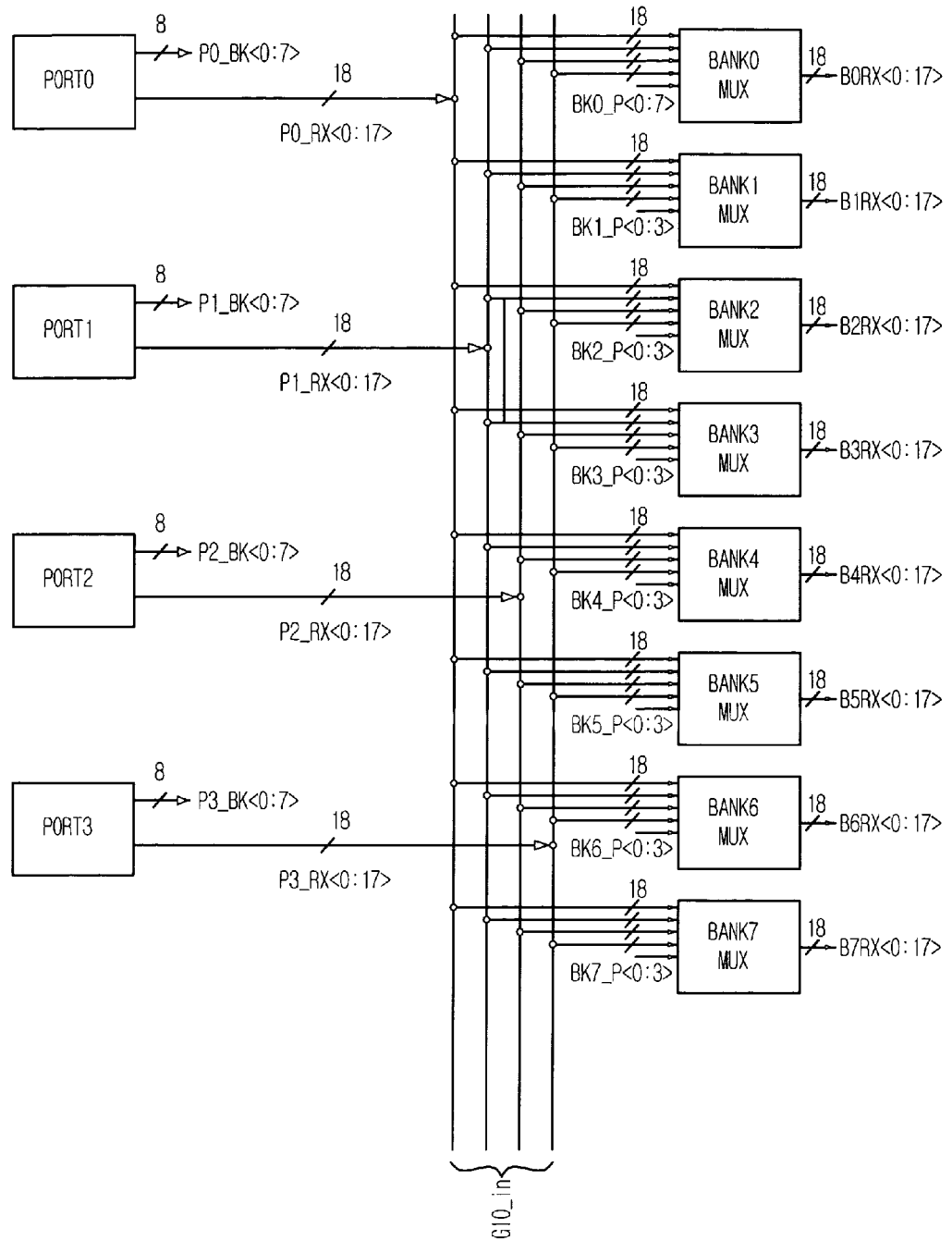
FIG. 7 is a signal diagram illustrating a signal input path from ports to banks.
Figure 8:
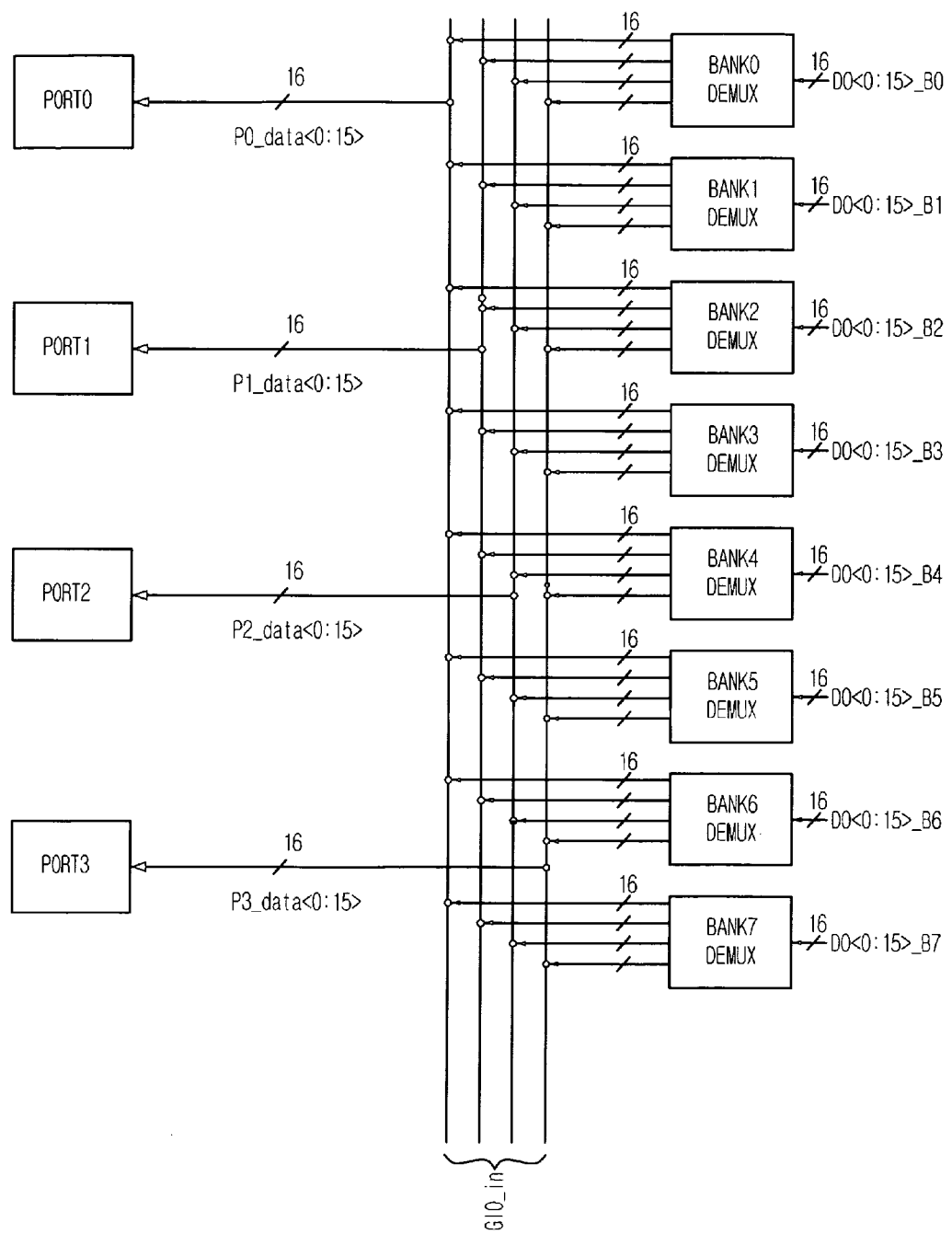
FIG. 8 is a signal diagram illustrating a signal output path from banks to ports.
Figure 9:
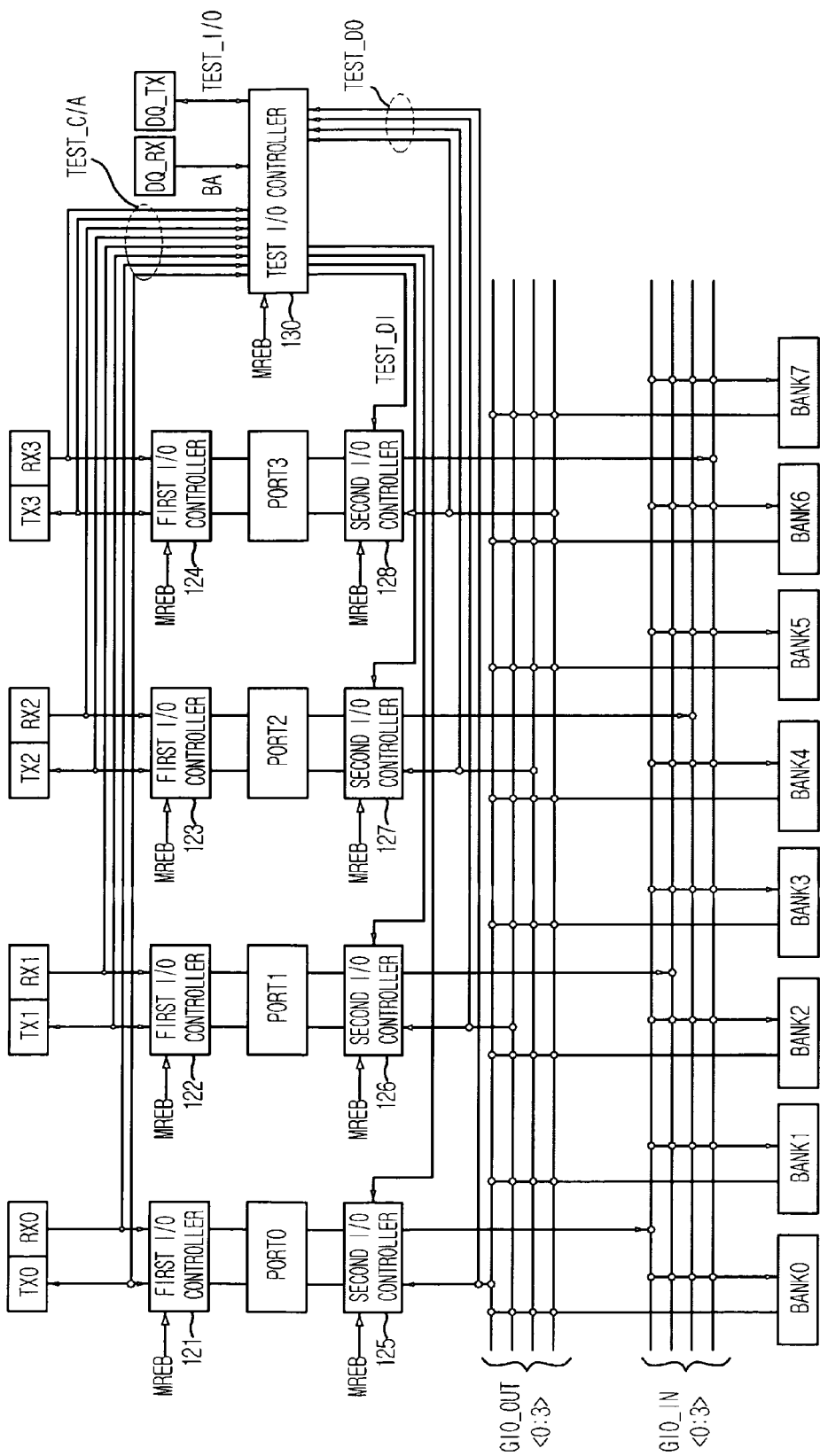
FIG. 9 is a block diagram of a multi-port memory device in accordance with an embodiment of the present invention.

FIG. 9 is a block diagram of a multi-port memory device in accordance with an embodiment of the present invention.

For convenience of explanation, a multi-port memory device having four ports and eight banks is illustrated. Particularly, it is assumed that the multi-port memory device has a 16-bit data frame and performs a 64-bit prefetch operation.

As shown, the multi-port memory device includes first to fourth ports PORT0 to PORT3, first to eighth banks BANK0 to BANK7, first and second global input/output (I/O) data buses GIO_OUT<0:3> and GIO_IN<0:3>. Each of the ports PORT0 to PORT3 is respectively connected to first and second I/O controllers. The first I/O controllers 121 to 124 are arranged between I/O pads TX and RX and the ports PORT0 to PORT3; and the second I/O controllers 125 to 128 are arranged between the ports PORT0 to PORT3 and the global data buses GIO_OUT<0:3> and GIO_IN<0:3>. For example, the first I/O controller 121 is arranged between the I/O pads TX0 and RX0 and the first port PORT0; and the second I/O controller 125 is arranged between the first port PORT0 and the global data buses GIO_OUT<0:3> and GIO_IN<0:3>. The multi-port memory device further includes a test I/O controller 130. The operations of the first and the second I/O controllers 121 to 128 and the test I/O controller 130 are controlled by a test enable signal MREB. The test enable signal MREB is inactive as a logic high level for a normal operation and active as a logic low level for a test operation. When the test enable signal MREB is inactive, data is transmitted between the I/O pads RX and TX and the global I/O data buses GIO_IN<0:3> and GIO_OUT<0:3> through the ports PORT0 to PORT3. Meanwhile, when the test enable signal MREB is active, the I/O controllers 121 to 128 block data transmission through the ports PORT0 to PORT3. That is, the test operation is performed through the test I/O controller 130.

Figure 10:
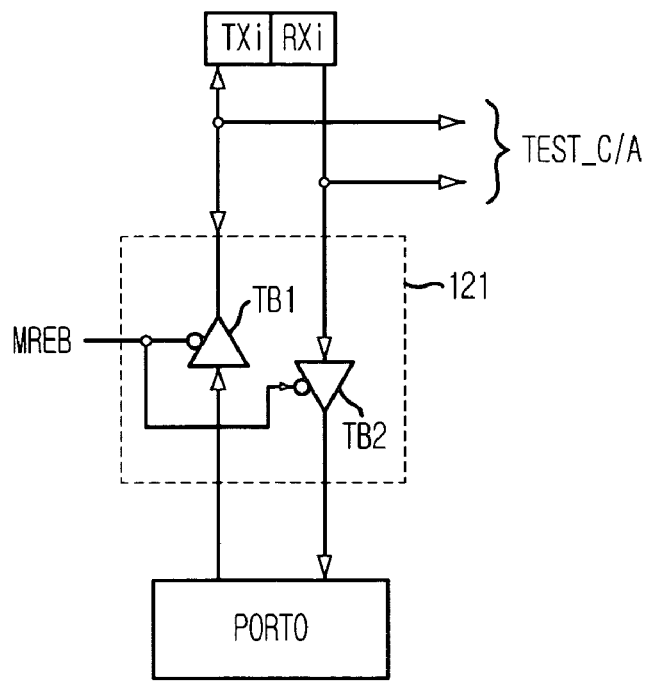
FIG. 10 is a schematic circuit diagram of a first input/output (I/O) controller coupled to the first port shown in FIG. 9.

FIG. 10 is a schematic circuit diagram of the first I/O controller 121 coupled to the first port PORT0 shown in FIG. 9.

The first I/O controller 121 includes two tri-state buffers TB1 and TB2. The first tri-state buffer TB1 transmits the data from the first port PORT1 to the transmission port TX0 in response to the test enable signal MREB. The second tri-state buffer TB2 transmits the data from the reception pad RX0 to the first port PORT0 in response to test enable signal MREB. The other first I/O controllers 122 to 124 have a similar structure as that of the first I/O controller 121 shown in FIG. 10.

Figure 11:
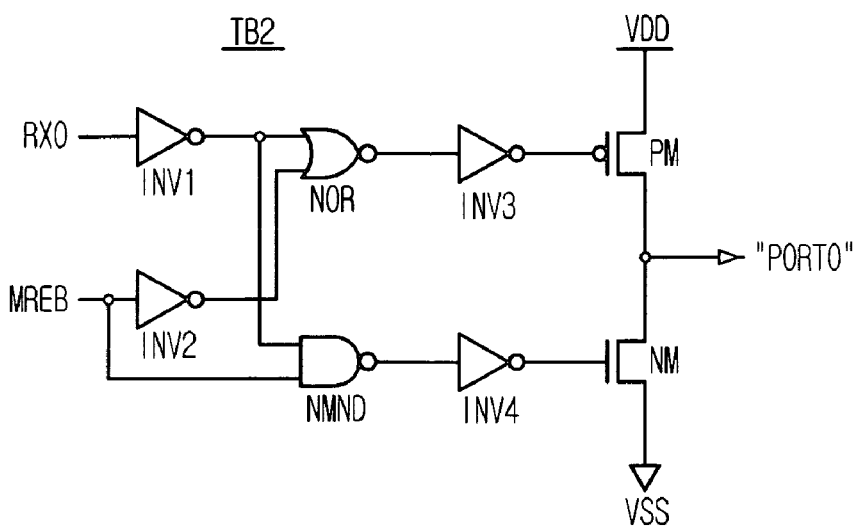
FIG. 11 is a schematic circuit diagram of a second tri-state buffer shown in FIG. 10.

FIG. 11 is a schematic circuit diagram of the second tri-state buffer TB2 shown in FIG. 10.

The tri-state buffer TB2 includes four inverters INV1 to INV4, a NOR gate NOR, a NAND gate NAND, a PMOS transistor PM, and an NMOS transistor NM. The first inverter INV1 inverts the data input through the reception pad RX0. The second inverter INV2 inverts the test enable signal MREB. The NOR gate NOR logically combines outputs of the first and the second inverters INV1 and INV2. The third inverter INV3 inverts an output of the NOR gate NOR. The NAND gate NAND logically combines the output of the first inverter INV1 and the test enable signal MREB. The fourth inverter INV4 inverts an output of the NAND gate NAND. The PMOS transistor PM and the NMOS transistor NM are serially connected each other between a power supply voltage VDD terminal and a ground voltage VSS terminal. The PMOS transistor PM receives an output of the third inverter INV3 through its gate. The NMOS transistor NM receives an output of the fourth inverter INV4 through its gate. A voltage loaded at a common node of the PMOS transistor PM and the NMOS transistor NM is outputted to the first port PORT0 when the test enable signal MREB is inactive as the logic high level for a normal read operation. When the test enable signal MREB is active as the logic low level, the second tri-state buffer TB2 becomes a high impedance state and, therefore, the data inputted through the reception pad RX0 is not transmitted to the first port PORT0. In this case, the data is transmitted to the test I/O controller 130 as a test command/address (C/A).

The first tri-state buffer TB1 has a similar structure as the second tri-state buffer TB2 shown in FIG. 11, however, the input and output replace each other. That is, the first tri-state buffer TB1 receives the data outputted from the first port PORT0 and outputs the voltage loaded at the common node to the transmission pad TX0 when the test enable signal MREB is inactive as the logic high level for a normal read operation.

Figure 12:
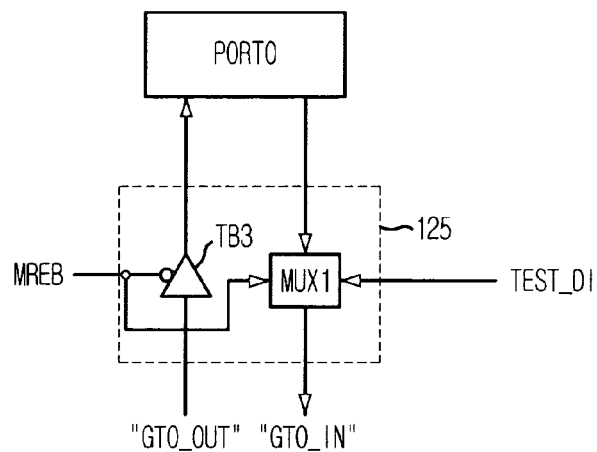
FIG. 12 is a schematic circuit diagram of a second I/O controller shown in FIG. 9.

FIG. 12 is a schematic circuit diagram of the second I/O controller 125 shown in FIG. 9.

The second I/O controller 125 includes a third tri-state buffer TB3 and a first multiplexer MUX1. The third tri-state buffer TB3 transmits data from the first global I/O data bus GIO_OUT<0:3> to the first port PORT0 in response to the test enable signal MREB. The third tri-state buffer TB3 has the similar circuitry as that of the second tri-state buffer TB2 shown in FIG. 11. That is, the third tri-state buffer TB3 transmits the data input from the first global I/O data bus GIO_OUT<0:3> to the first port PORT1 for the normal read operation. When the test enable signal MREB is active as the logic low level, the data from the first global data bus GIO_OUT<0:3> is transmitted to the test I/O controller 130 as test output data TEST_DO. The first multiplexer MUX1 selects one of data inputted from the first port PORT0 and the test input data TEST_DI inputted from the test I/O controller 130 in response to the test enable signal MREB and outputs the selected one to the second global data bus GIO_IN<0:3>. In detail, the first multiplexer MUX1 selects the data from the first port PORT0 in response to the test enable signal MREB of the logic high level; and selects the test input data TEST_DI in response to the test enable signal MREB of the logic low level. That is, the multiplexer transmits the data from the first port PORT0 to the second global data bus GIO_IN<0:3> for the normal write operation; and transmits the test input data TEST_DI from the test I/O controller 130 for a test operation. The other second I/O controllers 126 to 128 have a similar structure with that of the second I/O controller 125 shown in FIG. 12.

Figure 13:
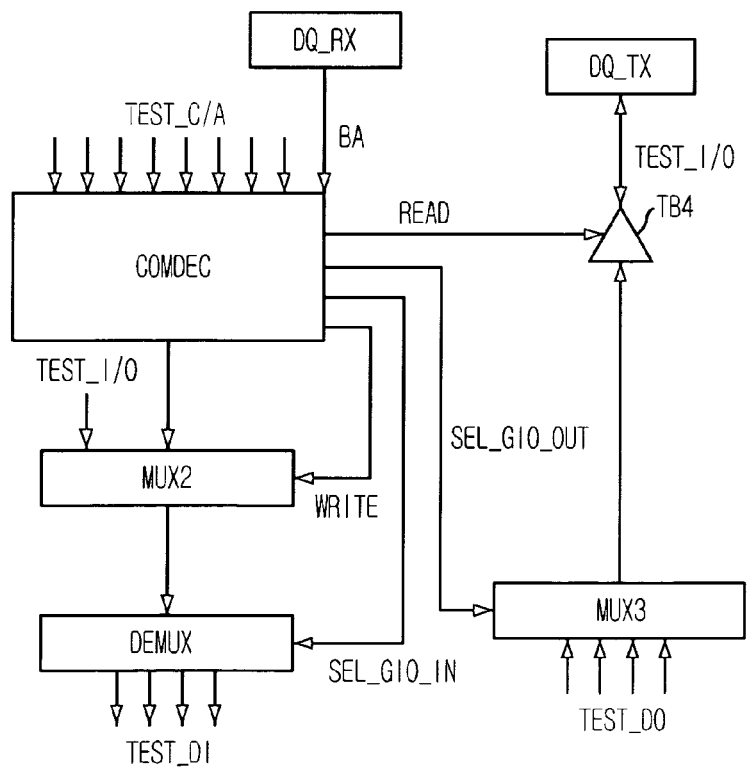
FIG. 13 is a detailed block diagram of a test I/O controller shown in FIG. 9.

FIG. 13 is a detailed block diagram of the test I/O controller 130 shown in FIG. 9.

The test I/O controller 130 includes a command decoder COMDEC, a fourth tri-state buffer TB4, a demultiplexer DEMUX, and second and third multiplexers MUX2 and MUX3. The command decoder COMDEC decodes the test C/A to thereby generate an internal read command READ and an internal write command WRITE. Further, the command decoder COMDEC buffers the test C/A and a bank address BA and outputs them to the second multiplexer MUX2. The command decoder COMDEC may receive the test enable signal MRENB and a predetermined control signal M<0:2> from an external device for generating the internal commands, i.e., the internal read command READ and the internal write command WRITE. In some embodiments, the control signal M<0:2> may be used as the bank selection signal for normal operation. The command decoder COMDEC further generates first and second GIO selection signals SEL_GIO_OUT and SEL_GIO_IN. Each of the first and the second GIO selection signals SEL_GIO_OUT and SEL_GIO_IN has a predetermined number selected from 0 to 3 and selects corresponding global data line. The second multiplexer MUX2 receives the test C/A and the bank address BA from the command decoder COMDEC and a test I/O signal TEST_I/O input through a test transmission pad DQ_TX and transmits them to the demultiplexer DEMUX in response to the internal write command WRITE. The demultiplexer DEMUX outputs the test input data TEST_DI from the second multiplexer MUX2 to the second I/O controllers 125 to 128 in response to the second GIO selection signal SEL_GIO_IN. For example, if the second GIO selection has "3", the test input data TEST_DI is output to the second I/O controller 128 and transmitted to the second global data line GIO_IN<3>. The third multiplexer MUX3 selects the test output data TEST_DO from the first global data bus GIO_OUT<0:3> in response to the first GIO selection signal SEL_GIO_OUT and transmits the selected one to the fourth tri-state buffer TB4. For example, if the first GIO selection signal SEL_GIO_OUT has "3", the test output data TEST_DO from the first global data line GIO_OUT<3> is selected. The fourth tri-state buffer TB4 transmits the selected test output data TEST_DO to the test transmission pad DQ_TX in response to the internal read command READ.

Hereinafter, the test operation of the multi-port memory device is described. During the test operation, the test enable signal MREB is maintained at the logic low level; and the data input through the I/O pads, i.e., the test C/A, includes information about commands and column/row addresses.

For the test write operation, the first I/O controllers 121 to 124 block the data transmission between the I/O pads RXi and TXi and the ports PORT0 to PORT3. Therefore, the data inputted through the I/O pads RXi and TXi is bypassed to the test I/O controller 130 as the test C/A. The bank address BA and the test I/O signal TEST_I/O are input through the test pad DQ_RX and DQ_TX. The command decoder COMDEC of the test I/O controller 130 generates the internal write command WRITE based on the test C/A and outputs the test input data TEST_DI in response to the internal write command WRITE. The test I/O controller 130 transmits the test input data TEST_DI to a corresponding second I/O controller selected from the second I/O controllers 125 to 128 in response to the second GIO selection signal SEL_GIO_IN. The first multiplexer MUX1 included in the corresponding second I/O controller selects the test input data TEST_DI in response to the test enable signal MREB and transmits the test input data TEST_DI to a corresponding second global data bus GIO_IN. The banks BANK0 to BANK7 receive the test input data TEST_DI through the second global data bus GIO_IN and determine the destination of the test I/O signal TEST_I/O based on the bank address BA. The test I/O signal TEST_I/O and the bank address BA are included in the test input data TEST_DI. When a certain bank of the banks BAND0 to BANK7 is determined as the destination of the test I/O signal TEST_I/O, the bank writes the test I/O signal TEST_I/O to a corresponding memory cell according to the test C/A including information about the column/row addresses.

Next, for the test read operation, the test I/O controller 130 generates the internal read command READ based on the test C/A and transmits information about bank address BA and column/row address to the banks BANK0 to BANK7. Then, the corresponding bank outputs the test output data TEST_DO through the first global data bus GIO_OUT<0:3>. The third tri-state buffer TB3 included in the second I/O controllers 125 to 128 blocks the data transmission between the first global data bus GIO_OUT<0:3> to the ports PORT0 to PORT7 in response to the test enable signal MREB. Therefore, the test output data TEST_DO loaded at the first global data bus GIO_OUT<0:3> is transmitted to the test I/O controller 130. The third multiplexer MUX3 of the test I/O controller 130 selects one of the test output data TEST_DO transmitted through the first global data bus GIO_OUT<0:3> in response to the first GIO selection signal SEL_GIO_OUT and transmits the selected one to the fourth tri-state buffer TB4. The fourth tri-state buffer TB4 outputs the test output data TEST_DO as the test I/O signal TEST_I/O in response to the internal read command READ.

The above embodiment of the present invention allocates two I/O controllers, i.e., the first and the second I/O controller, for each port. However, it is also possible to design a single I/O controller coupled to each port.

Figure 14:
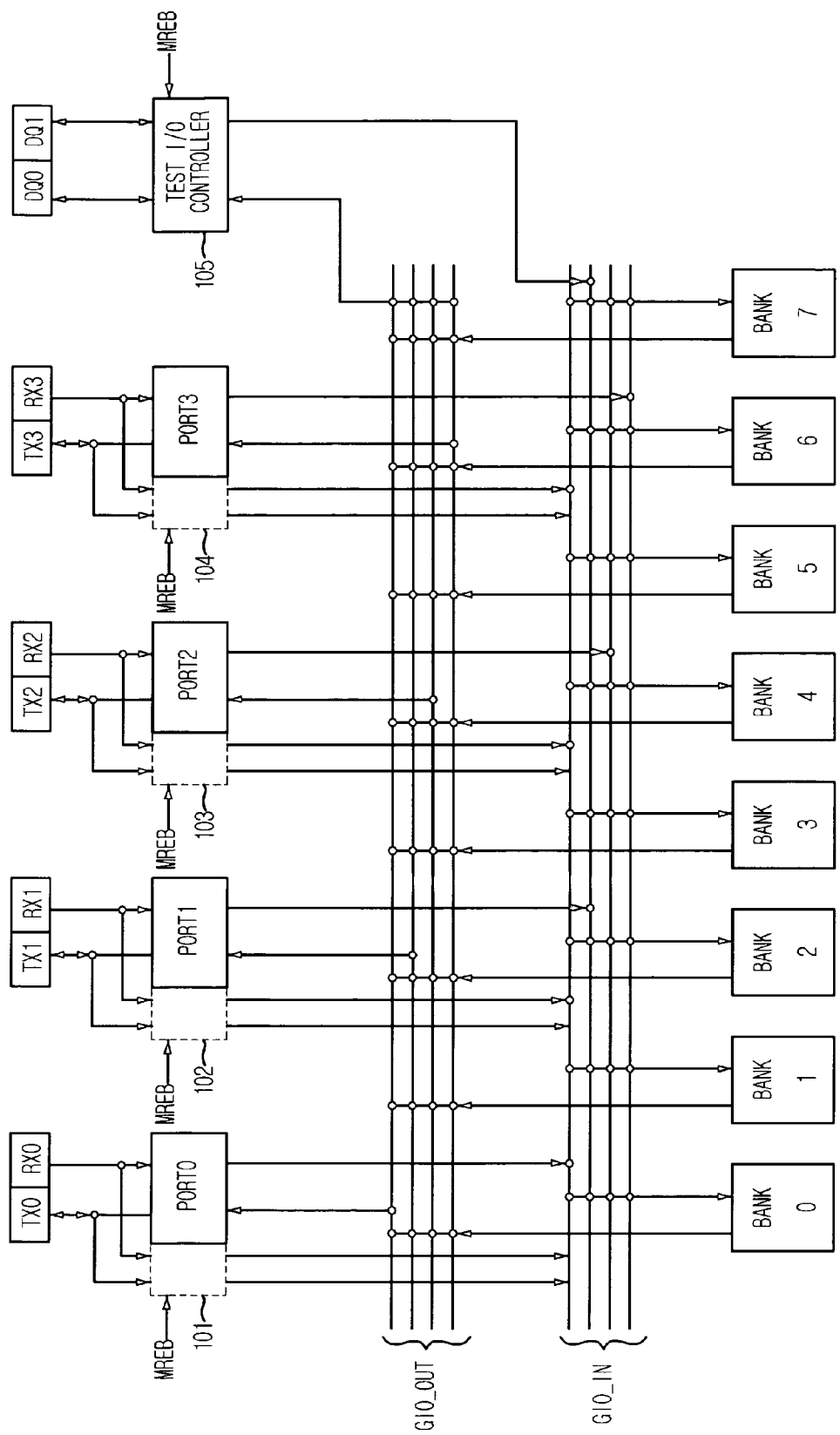
FIG. 14 is a block diagram of a multi-port memory device in accordance with another embodiment of the present invention.

FIG. 14 is a block diagram of a multi-port memory device in accordance with another embodiment of the present invention.

As shown, each of ports PORT0 to PORT4 is coupled to a single I/O controller 101 to 104. In this case, the ports PORT0 to PORT4 are designed to be blocked for the test operation and to transmit data for the normal operation.

As described above, the multi-port memory device in accordance with the present invention performs the test operation by directly transmitting data between test device and the banks without passing through the ports. Therefore, the test operation is effectively performed with the test devices whose data transmission speed is relatively slower than that of the ports. Further, the test reliability is improved because the test operation is not affected by the port error.

While the present invention has been described with respect to the specific embodiments, it will be apparent to those skilled in the art that various changes and modifications may be made without departing from the spirit and scope of the invention as defined in the following claims.

What is claimed is:

1. A multi-port memory device, comprising:
a plurality ports for performing a serial input/output (I/O) data transmission;
a plurality of I/O pads coupled to the ports;
a plurality of banks for performing a parallel I/O data transmission with the ports;
a plurality of global data buses for transmitting data between the ports and the banks;
a test I/O controller for transmitting a test signal and a test input signal to the banks through the global data buses without passing through the ports and transmitting a test output signal from the banks in response to the test signal through the global data buses during a test operation mode.

2. The multi-port memory device as recited in claim 1, wherein each of the I/O pads includes:
a general I/O pad for receiving the test signal during the test operation; and
a test I/O pad for receiving the test input signal and outputting the test output signal.

3. The multi-port memory device as recited in claim 2, wherein the test signal is input to the general I/O pad in parallel.

4. The multi-port memory device as recited in claim 1, wherein the global data buses include:
a first global data bus for receiving the test signal and the test input signal from the test I/O controller; and
a second global data bus for transmitting the test output signal to the test I/O controller.

5. A multi-port memory device, comprising:
a plurality ports for performing a serial input/output (I/O) data transmission;
a plurality of banks for performing a parallel I/O data transmission with the ports;
a plurality of global data buses for transmitting data between the ports and the banks;
a first I/O controller for controlling a serial data transmission between the ports and external devices;
a second I/O controller for controlling a parallel data transmission between the ports and the global buses; and
a test I/O controller for generating test commands based on a test command/address (C/A) inputted from the external devices and transmitting a test I/O data through the global data bus during a test operation mode.

6. The multi-port memory device as recited in claim 5, wherein the first I/O controller transmits data between the ports and the external devices during a normal operation mode and blocks the serial data transmission during the test operation mode in response to a test enable signal enabled during the test operation mode.

7. The multi-port memory device as recited in claim 5, wherein the first I/O controller includes:
a first tri-state buffer for controlling a data transmission from the external devices to the ports; and
a second tri-state buffer for controlling a data transmission from the ports to the external devices.

8. The multi-port memory device as recited in claim 5, wherein the test I/O controller includes:

a command decoder for decoding the test C/A to thereby generate an internal read command and an internal write command, buffering and outputting the test C/A and a bank address, and generating a global data bus selection signal;

a first multiplexer (MUX) for outputting the test C/A, the bank address, and the test I/O data as a test input signal in response to the internal write command;

a demultiplexer (DEMUX) for transmitting the test input signal to the second I/O controller in response to the global data bus selection signal;

a second MUX for outputting a test output signal transmitted from the global data bus in response to the global data bus selection signal; and a third tri-state buffer for outputting the test output signal in response to the internal read command.

9. The multi-port memory device as recited in claim 8, wherein the command decoder is controlled by the test enable signal.

10. The multi-port memory device as recited in claim 8, wherein the second I/O controller includes:

a fourth tri-state buffer for controlling a data transmission from the global data bus to the ports in response to the test enable signal; and a third MUX for selecting one of the test input signal and the data transmitted from the ports in response to the test enable signal and outputting the selected one to the global data bus.

11. The multi-port memory device as recited in claim 5, wherein each global data bus is provided with a plurality of first global data buses employed for a data transmission from the banks to the ports and a plurality of second global data buses employed for a data transmission from the ports to the banks.

12. The multi-port memory device as recited in claim 8, wherein the test I/O controller includes:

a column decoder for decoding the test C/A to thereby generate an internal read command and an internal write command, buffering and outputting the test C/A and a bank address, and generating first and second global data bus selection signals;

a first multiplexer (MUX) for outputting the test C/A, the bank address, and the test I/O data as a test input signal in response to the internal write command;

a demultiplexer (DEMUX) for transmitting the test input signal to the second I/O controller in response to the second global data bus selection signal;

a second MUX for outputting a test output signal transmitted from the first global data bus in response to the first global data bus selection signal; and a third tri-state buffer for outputting the test output signal in response to the internal read command.

13. The multi-port memory device as recited in claim 12, wherein the second I/O controller includes:

a fourth tri-state buffer for controlling a data transmission from the first global data bus to the ports in response to the test enable signal; and a third MUX for selecting one of the test input signal and the data transmitted from the ports in response to the test enable signal and outputting the selected one to the second global data bus.

14. A multi-port memory device, comprising:

a plurality of I/O pads;

a plurality ports performing a serial input/output (I/O) data transmission with external devices through the I/O pads;

a plurality of global data buses transmitting data between the ports and the banks;

a plurality of banks performing a parallel I/O data transmission with the ports through the global data buses;

a first I/O controller for controlling a serial data transmission between the ports and external devices;

a second I/O controller for controlling a parallel data transmission between the ports and the global buses; and a test I/O controller for generating test commands based on a test command/address (C/A) inputted from the external devices and transmitting a test I/O data with the global data bus during a test operation mode.

15. The multi-port memory device as recited in claim 14, wherein the I/O pads are used for a serial I/O interface for a normal operation mode and used for a parallel I/O interface for the test operation mode.

* * * * *